United States Patent
Nuttall (12)

(10) Patent No.: US 6,235,613 B1
(45) Date of Patent: May 22, 2001

(54) METHOD OF PRODUCING HSG USING AN AMORPHOUS SILICON DISORDERED LAYER AS A SUBSTRATE

(75) Inventor: Michael Nuttall, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/190,530

(22) Filed: Nov. 12, 1998

Related U.S. Application Data

(60) Continuation of application No. 08/926,275, filed on Sep. 5, 1997, now Pat. No. 5,831,282, which is a division of application No. 08/550,663, filed on Oct. 31, 1995, now abandoned.

(51) Int. Cl.$^7$ .................................................. H01L 21/36
(52) U.S. Cl. .......................................... 438/482; 438/482
(58) Field of Search ........................................ 438/255, 261, 438/263, 430, 365, 368, 482, 396, 398, 647, 657, 658, 660, 684, 964, 605, 705, 922

(56) References Cited

U.S. PATENT DOCUMENTS

| | | | |
|---|---|---|---|
| 5,407,534 | 4/1995 | Thakur | 156/662 |
| 5,478,769 | * 12/1995 | Lim | 437/52 |
| 5,597,754 | * 1/1997 | Lou et al. | 437/52 |
| 5,608,247 | 3/1997 | Brown | 257/306 |
| 5,629,223 | * 5/1997 | Thakur | 438/398 |
| 5,639,685 | * 6/1997 | Zahurak et al. | 437/60 |
| 5,639,689 | * 6/1997 | Woo | 438/482 |
| 5,658,381 | 8/1997 | Thakur et al. | 257/309 |
| 5,831,282 | * 11/1998 | Nuttall | 257/64 |

OTHER PUBLICATIONS

Wolf et al., Silicon processing for the VLSI Era, vol. 1, pp. 179–180.

* cited by examiner

Primary Examiner—David Nelms
Assistant Examiner—David Nhu
(74) Attorney, Agent, or Firm—Reed Smith LLP

(57) ABSTRACT

A method is provided for forming hemispherical grain silicon on an integrated circuit semiconductor substrate in a processing reactor. The method includes the steps of forming a doped silicon layer upon the semiconductor substrate and forming an amorphous silicon layer upon the doped silicon layer. A hemispherical grain silicon layer is formed upon the amorphous silicon layer. The doped silicon layer is formed at a first deposition temperature and the amorphous silicon layer is formed at a second deposition temperature wherein the second deposition temperature is lower than the first deposition temperature. The first deposition temperature is, for example, in excess of approximately 590° C. and is preferably approximately 625° C. The second deposition temperature is less than approximately 560° C. and is preferably approximately 555° C. The various layers are deposited without removing the semiconductor substrate from the processing reactor. The depositions can be performed as a continuous deposition of silicon at varying temperatures. The doped polysilicon layer can be formed of doped polysilicon material or doped amorphous silicon and the amorphous silicon layer can be formed of an undoped material.

15 Claims, 1 Drawing Sheet

METHOD OF PRODUCING HSG USING AN AMORPHOUS SILICON DISORDERED LAYER AS A SUBSTRATE

This application is a continuation of Ser. No. 08/926,275 filed Sep. 5, 1997, U.S. Pat. No. 5,831,282 which is a Divisional of Ser. No. 08/550,663 filed Oct. 31, 1995 abandoned.

BACKGROUND OF THE INVENTION

1. Field of Invention

This invention relates to the field of semiconductor integrated circuit fabrication and, in particular, to the field of fabrication of capacitors within semiconductor integrated circuits.

2. Background Art

The miniaturization of electrical components and their integration on a single piece of semiconductor material has been the catalyst for a worldwide information revolution. As integrated circuit technology has progressed, it has become possible to store and process increasing amounts of digital data in a smaller space at less expense and still access the data randomly, quickly and reliably. One of the most important areas where this miniaturization has occurred has been in the area of dynamic random access memory (DRAM). Miniaturization has also occurred in many other areas of semiconductor fabrication.

As this trend continues, one of the integrated circuit structures which must be miniaturized is capacitors. For example, DRAMs are formed of a large number of storage nodes which require transistors and capacitors in order to store information.. The state of the art of fabricating the storage nodes of DRAM circuits has progressed to the point where the transistors of the DRAM nodes can be made much smaller than the capacitors. Thus the shrinking of capacitors is an important goal in the continuing trend of miniaturizing DRAM circuits.

In order to reach this goal, the smaller capacitors must possess a minimum amount of capacitance and permit the sense amp to accurately determine the contents of the node. If a capacitor has too little capacitance it loses the charge placed upon it too quickly, causing it to have errors in data storage. Thus, it is essential that the electrodes of storage node capacitors be large enough to accurately store an adequate charge in spite of parasitic capacitances and noise that may be present during circuit operation.

The capacitance, C, of a capacitor depends upon the dielectric constant, $\epsilon$, of the material placed between the electrodes of the capacitor, the distance, d, between the electrodes, and the effective surface area, A, of the electrodes. The relationship may be expressed $C=A\epsilon/d$. In many cases the material used as the dielectric between the electrodes of the capacitor is limited to only a few possibilities. Also, the minimum distance between the capacitor electrodes is generally limited to a particular value in order for[]the number of fabrication defects to be kept to an acceptably low value. For example, the minimum distance between the plates of the capacitor is determined by the breakdown field of the dielectric material. For a given voltage, if the capacitor plates are too close together, the electric field in the dielectric material exceeds its breakdown value and the dielectric fails. Thus, the parameter that can most easily be varied to obtain increased storage capacity in DRAM capacitors is the effective surface area of the capacitor electrodes.

Therefore, it is a goal of capacitor miniaturization to maximize the effective surface area of capacitor electrodes as much as possible. Various three dimensional structures have been proposed and adopted in order to maintain the value of capacitors at a high level while keeping the planar surface area of the DRAM, or the footprint area, allocated to the capacitor at a minimum. Among the proposed methods for maintaining cell capacitance while decreasing the footprint area devoted to the cell capacitor is one described in Lu, N. C. C., "Advanced Structures for Dynamic RAMs", IEEE *Circuits and Devices Magazine*, pages 27–35, (January, 1989).

Lu describes a trench transistor cell in this reference. In the trench transistor cell described in the Lu paper, the capacitor cell is a vertical structure with an access transistor which is also vertical. The access transistor is placed above the cell capacitor. The described trench cell provides greater capacitor electrode area in a small footprint area when compared to many planar capacitor structures. However, methods of this type do not address the problem of increasing the effective surface area of the-electrodes of capacitors.

It is well known in the prior art of semiconductor fabrication that the storage capacitance of a capacitor can be enhanced without increasing either the footprint area or the storage electrode height by using hemispherical grain silicon (HSG) to form a capacitor electrode. The increase in capacitance provided by the use of HSG is due to the increase in the surface area of the electrodes. The increase in the surface area of the electrodes is due to the presence of the grains and the shape of the grains on the surface of the polysilicon forming the electrodes.

Many methods for forming HSG are known in the prior art. The known methods include low- pressure chemical vapor deposition (CVD), cold wall CVD, and seeding a layer of amorphous silicon followed by annealing of the layer. In the seeding and annealing method a layer of amorphous silicon is seeded, for example with silane or disilane, in order to form crystals upon the surface of the amorphous silicon material. The amorphous silicon material is then annealed to form the grains of the HSG around the seeds. The annealing of the seeded amorphous silicon can be performed at a temperature in excess of approximately 450° C. In this process, nucleation begins on the surface of the silicon as the gas is bled into the reaction chamber and the silicon is exposed to the heat and vacuum anneal. In this manner the smooth silicon is transformed into rugged HSG silicon.

In the low pressure CVD method for forming HSG, silicon is deposited while the temperature is in the transition regime from amorphous silicon to polycrystalline silicon. This is performed at about 555° C. at a pressure of 190 mtorr. Silane is typically used as a precursor for this deposition. If the deposition takes place at a lower temperature amorphous silicon is deposited. If the deposition takes place at a higher temperature, polycrystalline silicon is deposited. In the transition regime HSG is deposited.

In a typical example of the known methods for forming HSG, as shown in FIG. 1, HSG layer 18 is formed within an electrode structure 10 over a doped silicon layer 12 in a processing reactor such as a conventional CVD chamber. Doped silicon layer 12 could, for example, be doped polysilicon or a doped amorphous silicon layer. When the doped polysilicon layer 12 is formed a flow of dopant is provided while the polysilicon material is deposited. The depositing of polysilicon layer 12 could be performed, for example, at approximately 625° C. and 150 mtorr.

However, using the low pressure CVD method, the depositing of HSG layer 18 could not be performed directly upon the surface of the doped silicon layer 12. Therefore, after formation of the polysilicon layer 12, a thin layer 14 of native oxide is formed upon the surface of polysilicon layer 12, by a reaction with oxygen in the air as the wafers were pushed into the deposition furnace after a hydrofluoric acid clean to prepare the surface. Typically, native oxide layer 14 is formed with a thickness of approximately ten angstroms. Native oxide layer 14 formed in this manner provided a disordered surface upon which the HSG layer 18 could be formed.

However, native oxide layer 14 somewhat degraded the electrical properties of the integrated circuit. Furthermore, in order to form native oxide layer 14 using this prior art method, electrode structure 10 had to be removed from the furnace for cleaning. This added expense to the process of fabricating electrode structure 10.

Another prior art method for forming the native oxide layer 14 of electrode structure 10, the $O_2$ flash method, permitted the formation of native oxide layer 14 in situ. Forming the oxide layer 14 in situ-in the $O_2$ method eliminated the additional expense of removing electrode structure 10 from the polysilicon furnace of the CVD chamber to perform the oxidation step. However, performing the $O_2$ flash method required connecting oxygen to the polysilicon deposition furnace. Connecting oxygen to the furnace increased the complexity of the fabrication process and introduced a possible safety hazard.

In view of the foregoing it would be an advance in the art of semiconductor integrated circuit fabrication to provide a structure and a method for forming such a structure on an integrated circuit which provides a high capacitance per square unit of planar surface area of a wafer, wherein the structure can be reliably manufactured. It would be a further advance in the art of semiconductor fabrication to provide an improved capacitor structure and a method for forming such a capacitor structure on an integrated circuit which is particularly adapted for integration into DRAM memory cells.

It is therefore an object of the present invention to provide an integrated circuit capacitor structure and method for forming such an integrated circuit capacitor structure that provides increased capacitance using HSG.

It is a further object of the present invention to provide an integrated circuit capacitor structure and method for forming such an integrated circuit capacitor structure that permits in situ formation of HSG over a doped polysilicon layer without requiring oxygen to be connected to the deposition reactor.

It is a further object of the present invention to provide an integrated circuit capacitor structure and an in situ method for forming such an integrated circuit capacitor structure having improved electrical properties.

These and other objects and advantages of the invention will become more fully apparent from the description and claims which follow or may be learned by the practice of the invention.

SUMMARY OF THE INVENTION

A method is provided for forming hemispherical grain silicon on an integrated circuit semiconductor substrate in a processing reactor. The method includes the steps of forming a doped silicon layer upon the semiconductor substrate and forming an undoped amorphous silicon layer upon the doped silicon layer. A hemispherical grain silicon layer is formed upon the amorphous silicon layer. The doped silicon layer is formed at a first deposition temperature and the amorphous silicon layer is formed at a second deposition temperature wherein the second deposition temperature is lower than the first deposition temperature. The first deposition temperature is, for example, in excess of approximately 590° C. and is preferably approximately 625° C. The second deposition temperature is less than approximately 560° C. and is preferably approximately 530° C. The HSG deposition temperature is about 555° C. The various layers are deposited without removing the semiconductor substrate from the processing reactor. The depositions can be performed as a continuous deposition of silicon at varying temperatures.

BRIEF DESCRIPTION OF THE DRAWINGS

In order that the manner in which the above-recited and other advantages and objects of the invention are obtained can be appreciated, a more particular description of the invention briefly described above will be rendered by reference to a specific embodiment thereof which is illustrated in the appended drawings. Understanding that these drawings depict only a typical embodiment of the invention and are not therefore to be considered limiting of its scope, the invention and the presently understood best mode thereof will be described and explained with additional specificity and detail through the use of the accompanying drawings.

DETAILED DESCRIPTION OF THE INVENTION

Figure 1:
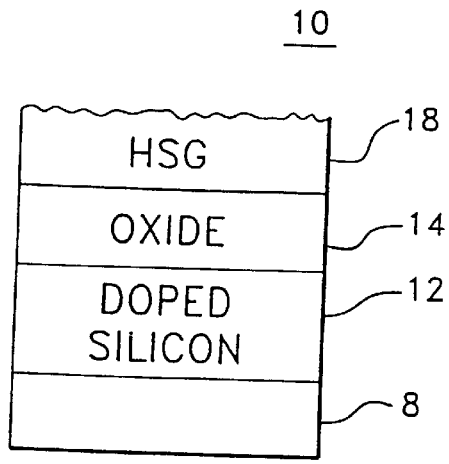
FIG. 1 shows a schematic representation of a portion of a prior art integrated circuit capacitor electrode having a layer of HSG deposited over a layer of doped polysilicon with a layer of native oxide therebetween.

Reference is now made to the drawings wherein like structures are provided with like reference designations. It will be understood that the drawings included herewith provide only diagrammatic representations of the presently preferred structure of the present invention and that structures falling within the scope of the present invention may include structures different than that shown in the drawings.

Figure 3:
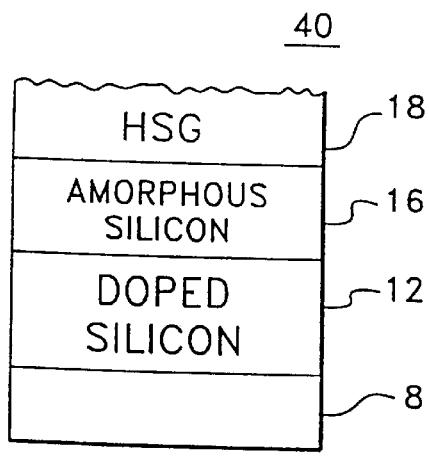
FIG. 3 shows a schematic representation of a portion of the integrated circuit capacitor electrode of the present invention having a layer of HSG deposited over a layer of polysilicon with a layer of amorphous silicon therebetween.
Figure 2:
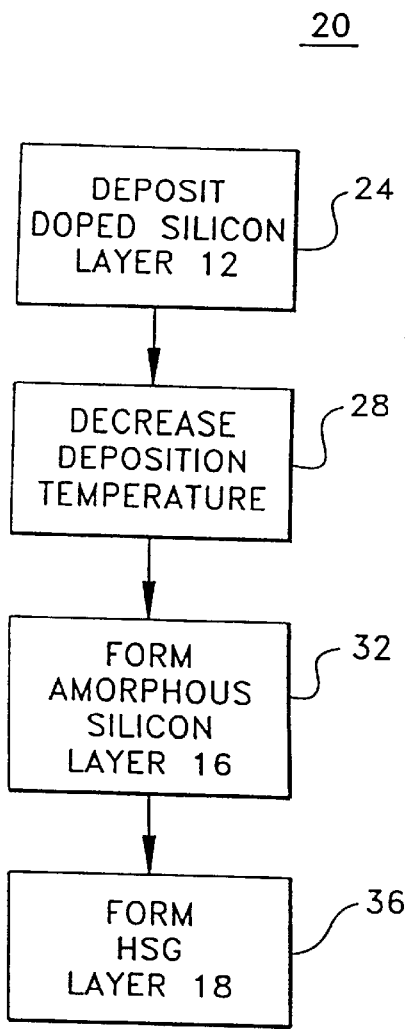
FIG. 2 shows a flow chart representation of the capacitor electrode fabrication method in accordance with the present invention.

Referring now to FIGS. 2 and 3, there are shown a flow chart representation of semiconductor electrode fabrication method 20 of the present invention and a portion of an integrated circuit electrode structure 40. Integrated circuit electrode structure 40 is formed in accordance with semiconductor electrode fabrication method 20.

In performing electrode fabrication method 20, doped silicon layer 12 is deposited over semiconductor wafer 8 of electrode structure 40 as shown in block 24. The formation of doped silicon layer 12 is performed by any conventional method known to those skilled in the art of semiconductor fabrication. For example, doped silicon layer 12, or silicon layer 12, can be formed using a CVD process within a conventional processing reactor such as a conventional CVD chamber. While it will be understood that doped silicon layer 12 can be formed of any kind of doped silicon material, in one embodiment of the invention it can be a polycrystalline material. In another embodiment it can be an amorphous silicon.

During the depositing of doped silicon layer 12, a flow of a dopant can be provided while the silicon material of layer 12 is deposited in order to provide the doping of layer 12. The temperature and pressure values during the silicon deposition step set forth in block 24 can be any values effective to produce a layer 12 of doped silicon. For example, a temperature of approximately 625° C. at a pressure of approximately 150 mtorr provides satisfactory results.

It is well known in the art that silicon is deposited in a polycrystalline form if the temperature of the deposition is maintained at a level in excess of approximately 590° C. at a pressure of approximately 150 mtorr. A typical value of temperature for depositing polysilicon can be approximately 625° C. as previously described when doped silicon layer 12 is polycrystalline silicon. It is also well known in the art that depositing silicon at temperatures substantially below 560° C. results in the formation of amorphous silicon rather than polycrystalline silicon. Thus either the embodiment wherein polysilicon is first deposited or the embodiment wherein amorphous silicon is deposited can be selected by appropriate setting of the temperature of the deposition of block 24.

Therefore, when doped polysilicon is deposited in accordance with one embodiment of the method of the present invention, the temperature of the CVD chamber is lowered, as shown in block 28, and further deposition of silicon material is then performed. Under these conditions, the depositing of polycrystalline silicon material terminates and the depositing of amorphous silicon material begins, thereby forming amorphous silicon layer 16 as shown in block 32. Amorphous silicon layer 16 can be deposited directly upon the surface of doped silicon layer 12. Furthermore, the formation of amorphous silicon layer 16 upon the surface of doped silicon layer 12 is performed without removing wafer 8 from the reaction chamber regardless of which embodiment of layer 12 is selected.

In a preferred embodiment of the present invention, a flow of silane is provided during the depositing step of block 32. The flow of silane assists in the depositing of amorphous silicon material upon the doped silicon layer 12. Silicon deposition at a temperature and pressure effective to provide amorphous silicon within the electrode fabrication method 20 is continued for a period of time in order to form amorphous silicon layer 16 of the required thickness upon doped silicon layer 12. The formation of amorphous silicon layer 16 is shown in block 32. A typical value for the deposition temperature of undoped amorphous silicon of block 32 is below 560° C., for example, 530° C. A typical value of pressure is 190 mtorr. Amorphous silicon layer 16 can be formed of undoped material.

The depositing of amorphous silicon is continued until the thickness of amorphous silicon layer 16 is in the range of approximately twenty angstroms to approximately eighty angstroms. It is understood that a substantial variation in the thickness of amorphous silicon layer 16 is possible within electrode fabrication method 20. If the thickness of amorphous silicon layer 16 is allowed to increase too much, however, the overall capacitor electrode structure 40 formed by electrode fabrication method 20 is unnecessarily thick and space is wasted. If the thickness of amorphous silicon layer 16 is too small, it is difficult to form a subsequent layer upon the surface of amorphous silicon layer 16.

After formation of the amorphous silicon layer 16 is complete, formation of HSG layer 18 is performed as shown in block 36 of electrode fabrication method 20. The formation of HSG layer 18 is performed without removing wafer 8 from the reaction chamber. The formation of HSG layer 18 upon amorphous silicon layer 16 is possible because the surface of amorphous silicon material is disordered in the manner required for HSG material to form thereupon. Thus amorphous silicon layer 16 of the electrode structure 40 performs the function previously performed by the native oxide layer 14 of prior art electrode structure 10, i.e., the function of providing a suitable surface over doped silicon layer 12 for the formation of HSG material. Therefore, HSG layer 18 can be disposed directly upon the surface of amorphous layer 16. In accordance with electrode fabrication method 20, amorphous silicon layer 16 is formed in a process requiring only in situ process steps and without requiring the use of oxygen for the oxidation of silicon layer 12.

The formation of HSG layer 18 can be performed using any method of HSG deposition known to those skilled in the art of semiconductor integrated circuit fabrication. For example, it is known that when silicon is deposited in a CVD chamber it is formed as HSG if the deposition is performed at a temperature between the range of temperatures effective to form amorphous silicon and the range of temperatures effective to form polycrystalline silicon. Thus, in electrode fabrication method 20 of the present invention, the formation of HSG layer 18 can be performed by increasing the temperature of the CVD chamber after the formation of the amorphous silicon material of layer 16. When performing the deposition of HSG layer 18 in this manner the temperature of the CVD chamber can be raised to between approximately 540° C. and approximately 575° C., for example. The preferred temperature is approximately 555° C.

Furthermore, it is to be understood that although the present invention has been described with reference to a preferred embodiment, various modifications, known to those skilled in the art may be made to the structures and process steps presented herein without departing from the invention as recited in the several claims appended hereto. For example, the method of the present invention can be used to form rugged silicon such as HSG over polysilicon material within any type of integrated circuit structure. In particular, the method of the present invention can be advantageously applied to the formation of HSG over doped polysilicon during the fabrication of any kind of integrated circuit capacitor.

What is claimed is:

1. A method for forming hemispherical grain silicon on an integrated circuit semiconductor substrate in a processing reactor, comprising the steps of:
    (a) forming a doped silicon layer upon said semiconductor substrate;
    (b) forming an undoped amorphous silicon layer upon said doped silicon layer said undoped amorphous silicon layer having an upper surface; and
    (c) forming a hemispherical grain silicon layer in addition to and upon said undoped amorphous silicon layer by depositing said hemispherical grain silicon layer upon said upper surface of said undoped amorphous silicon layer.

2. The method for forming hemispherical grain silicon of claim 1, wherein step (a) is performed at a first deposition temperature and step (b) is performed at a second deposition temperature different from said first deposition temperature.

3. The method for forming hemispherical grain silicon of claim 2, wherein said second deposition temperature is lower than said first deposition temperature.

4. The method for forming hemispherical grain silicon of claim 3, wherein said first deposition temperature is in excess of approximately 590° C. and said second deposition temperature is less than approximately 560° C.

5. The method for forming hemispherical grain silicon of claim 4, wherein said first deposition temperature is approximately 625° C.

6. The method for forming hemispherical grain silicon of claim 4, wherein said second deposition temperature is approximately 555° C.

7. The method for forming hemispherical grain silicon of claim 1, wherein said doped silicon layer comprises doped polysilicon material.

8. The method for forming hemispherical grain silicon of claim 1, wherein said doped silicon layer comprises amorphous silicon material.

9. The method for forming hemispherical grain silicon of claim 1, wherein steps (a)–(c) are performed without removing said semiconductor substrate from said processing reactor.

10. The method for forming hemispherical grain silicon of claim 1, wherein steps (a) and (b) are performed as a continuous deposition of silicon at varying temperatures.

11. The method for forming hemispherical grain silicon of claim 10, wherein step (c) is performed by said continuous deposition of silicon.

12. The method for forming hemispherical grain silicon of claim 1, wherein said undoped amorphous silicon layer has a thickness between approximately twenty angstroms and approximately eighty angstroms.

13. The method for forming hemispherical grain silicon of claim 1, wherein said doped silicon layer is deposited at a pressure of approximately 150 mtorr.

14. The method for forming hemispherical grain silicon of claim 13, wherein said undoped amorphous silicon layer is formed at a pressure of approximately 190 mtorr.

15. The method for forming hemispherical grain silicon of claim 14, wherein said hemispherical grain silicon is formed at a pressure of approximately 190 mtorr.

\* \* \* \* \*